United States Patent
Ghyselen et al.

(10) Patent No.: US 7,544,586 B2
(45) Date of Patent: Jun. 9, 2009

(54) METHOD OF FABRICATING CHIPS AND AN ASSOCIATED SUPPORT

(75) Inventors: Bruno Ghyselen, Seyssinet-Pariset (FR); Olivier Rayssac, Grenoble (FR)

(73) Assignee: S.O.I. Tec Silicon on Insulator Technologies, Bernin (FR)

( * ) Notice: Subject to any disclaimer, the term of this patent is extended or adjusted under 35 U.S.C. 154(b) by 617 days.

(21) Appl. No.: 11/136,252

(22) Filed: May 23, 2005

(65) Prior Publication Data

US 2005/0236700 A1  Oct. 27, 2005

(51) Int. Cl.
*H01L 21/00* (2006.01)
(52) U.S. Cl. ................................. 438/460; 438/462
(58) Field of Classification Search .......... 438/460–464
See application file for complete search history.

(56) References Cited

U.S. PATENT DOCUMENTS

| | | | |
|---|---|---|---|
| 5,393,706 A | 2/1995 | Mignardi et al. | 437/226 |
| 5,527,744 A | 6/1996 | Mignardi et al. | 437/226 |
| 5,904,548 A | 5/1999 | Orcutt | 438/462 |
| 6,933,212 B1 * | 8/2005 | Lee et al. | 438/464 |
| 7,452,739 B2 * | 11/2008 | Chu et al. | 438/33 |
| 2001/0048014 A1 | 12/2001 | Ichikawa et al. | 225/2 |
| 2008/0265376 A1 * | 10/2008 | Tsurume et al. | 257/618 |

FOREIGN PATENT DOCUMENTS

| | | |
|---|---|---|
| EP | 0 610 657 A2 | 8/1994 |
| EP | 1 160 853 A2 | 12/2001 |
| JP | 58048172 | 3/1983 |
| JP | 59172740 | 9/1984 |
| JP | 60108745 | 5/1985 |
| JP | 61267342 | 11/1986 |

\* cited by examiner

*Primary Examiner*—Richard A. Booth
(74) *Attorney, Agent, or Firm*—Winston & Strawn LLP

(57) ABSTRACT

A method of fabricating a plurality of chips, with each chip including at least one circuit. This method includes the successive steps of creating chips on a layer of semiconductor material that is integral with a substrate; forming a weakening pattern corresponding to a predetermined cutting pattern on a support; transferring the chip-containing layer from the substrate to the support; and forming individual chips by cutting the chip-containing layer in accordance with the predetermined cutting pattern. Also, an assembly for fabricating a plurality of chips, each chip including at least one circuit provided on a layer of semiconductor material that is carried by a support that includes a weakening pattern corresponding to a predetermined cutting pattern for forming individual chips, with the support being obtained by assembling a plurality of individual tiles with boundaries between the individual tiles corresponding to the weakening pattern. The tiles may be assembled by disposing a binder between the individual tiles, with the binder ensuring temporary bonding of the tiles.

30 Claims, 1 Drawing Sheet

METHOD OF FABRICATING CHIPS AND AN ASSOCIATED SUPPORT

BACKGROUND

The present invention relates in general to the fabrication of circuits of the electronic, optronic, and/or optoelectronic type on thin layers of semiconductor material such as silicon. More precisely, in a first aspect, the invention relates to a method of fabricating a plurality of chips, each chip comprising at least one circuit. In a second aspect, the invention also relates to a method of fabricating a support allowing the chip fabricating method to be implemented.

In general, the term "cutting" means an operation consisting in separating individual chips from each other.

The term "chip" means a module comprising one or more circuits.

The term "circuit" means any type of microelectronic, optoelectronic, optronic, and/or optoelectronic circuit.

The term "layers" as used here preferably means thin layers, of thickness which may be of the order of 0.1 micrometers ($\mu m$) to 10 $\mu m$, for example.

Finally, the circuits which are produced in this way are typically produced in repetitive manner, forming a plurality of identical circuits on a thin layer, which allows a plurality of identical chips to be formed in corresponding manner.

In general, methods of fabricating chips are already known. A first type of known method, it will be recalled, consists in producing chips directly in the surface portion of a massive substrate of semiconductor material (for example silicon or a Group III-V material). Once the chips have been formed, the substrate is cut through its entire thickness to separate the chips from one another. Cutting is carried out by scribing the substrate. When scribing, in general, a score line is initially scribed, after which the substrate is broken along the scribed line. One limitation with that type of method is that chips cannot be produced on a thin substrate. The massive substrates from which the chips are formed are relatively thick (of the order of at least one hundred micrometers—for example 725 $\mu m$ for a substrate that is 200 millimeters (mm) in diameter); such thicknesses may prove to be too large for certain applications.

Non-limiting examples of such applications for which massive substrates are unsuitable are:

the fabrication of chips comprising light-emitting diodes (LEDs), since too thick a substrate on which the chip is formed may influence the optical behavior of the circuits, for example, when the substrate absorbs part of the light; and the fabrication of chips that are required to have a degree of mechanical flexibility from substrates of the monocrystalline silicon type, which is a rigid, frangible material; thus, to provide the chip with the required flexibility, the substrate has to be thinner than the massive substrates used.

Clearly, it is possible to thin the back face of a massive substrate of the type mentioned above, into the surface layer on which the chips are formed (the back face of the substrate being defined here as the face opposite to the "front" face of the substrate, which is the face that carries the chips). By way of example, such thinning can be carried out by chemical etching of the back face of the substrate, or by mechanically attacking the back face. However, substrate thinning is necessarily limited as the substrate must retain a certain thickness (at least on the order of 50 pm) in order to retain an acceptable mechanical strength.

Further, applications such as those mentioned above, which require chips to be formed using a thin layer, remain difficult to access even after thinning. Thus, it can be seen that there are limitations associated with the first type of known method. It should also be noted that scribing chips may be associated with problems (e.g., flaking of the scribed substrate), which constitute a further limitation to that type of method.

A second type of method of producing chips on a substrate is also known. In that second type of method, the following steps are carried out:

creating chips on a layer of semiconductor material, the layer being integral with a substrate;

transferring a layer including the chips from the substrate to a support;

forming individual chaps by cutting the layer in accordance with a predetermined cutting pattern.

It is specified that the term "transfer" is understood it this text as an operation implying a bonding between a donor wafer (which can be referred to as the "top") and a receiver wafer (which can be referred to as the "base"), and a subsequent removal of excess material from the top wafer after bonding. More precisely, the "bonding" referred to for defining the "transfer" is a bonding based on molecular adhesion between two surfaces which have an extremely low roughness (typically on the order of a few angstroms, or a few tens of angstroms). The well known SMART-CUT® method is an example of such a transfer method.

It should also be mentioned that the term "predetermined pattern" means a pattern which has been manufactured to define the desired cutting lines. Thus, the chips are formed in the layer of semiconductor material before transferring the layer to a receiving support.

The layer of semiconductor material may be a "thin" layer, i.e. with a. thickness of the order of 0.1 $\mu m$ to 10 $\mu m$. The predetermined pattern typically corresponds to a grid with square or rectangular compartments, with the grid lines defining the boundaries of the chips.

Cutting is typically carried out by scribing the thin layer and, optionally and at the same time, the support with which the layer has been rendered integral.

The thin layer can be transferred to the support using any type of technique that is known per se. In particular, it is known that this transfer can be made by fracturing a zone of weakness provided between the thin layer to be transferred to the support and a substrate with which the thin layer is initially integral. This zone of weakness may be formed before fabricating the chips as mentioned above, or subsequently, if desired.

It is also possible that only certain steps in the chip fabrication are carried out before forming the zone of weakness, with the other steps for fabricating the chips being carried out after forming the zone of weakness. This zone of weakness can, for example, be produced by implanting one or more atomic and/or ionic species, as is the case with SMART-CUT® techniques. The zone of weakness can also be obtained by controlling the bonding energy between two layers presenting a common interface which defines the zone of weakness—these are broadly referred to as "detachable" substrates—wherein a layer can be transferred by applying a stress (mechanical and/or thermal in particular) at the level of the weakened interface. For example, a zone of weakness can thus be formed by creating a porous zone between two layers of substrate, or by producing a reversible bond between the two layers. Other methods can also be envisaged.

It should also be mentioned that it is also known to transfer a thick substrate onto the support, and then thin the transferred substrate via its back face (BSOI® or BESOI® type techniques). That produces a thin layer transferred onto a support. After transferring the thin layer and its circuits to the support, the layer is cut to form individual chips. That type of known method can produce chips having layers with a substantially reduced thickness. It can also allow chips to be formed an a support made of a material which is different from the material of the substrate in which the chips have been produced (the material of the thin layer), and it can have the desired nature and specific properties. However, the disadvantages mentioned above regarding scribing and in particular flaking remain. These disadvantages are more pronounced when scribing layers of small thickness. Thus, the present invention seeks to overcome these problems.

SUMMARY OF THE INVENTION

The invention relates to a method of fabricating a plurality of chips, with each chip comprising at least one circuit, which method comprises the following successive steps:
  creating chips on a layer of semiconductor material that is integral with a substrate;
  forming a weakening pattern corresponding to a predetermined cutting pattern on a support;
  transferring a layer of semiconductor material that contains the chips from the substrate to the support; and
  forming individual chips by cutting the chip-containing layer in accordance with the predetermined cutting pattern.

The invention also relates to a support for fabricating a plurality of chips, each chip comprising at least one circuit provided on a layer of semiconductor material that is carried by a support, with the support comprising a weakening pattern corresponding to a predetermined cutting pattern for forming individual chips, and the support being obtained by assembling a plurality of individual tiles with boundaries between the individual tiles corresponding to the weakening pattern.

BRIEF DESCRIPTION OF THE DRAWING FIGURES

Other aspects, aims, and advantages of the invention become more apparent from the following description made with reference to the accompanying drawings in which:

FIG. 2b illustrates a possible fabrication step to produce a support such as that of FIG. 2a;

Figure 4:
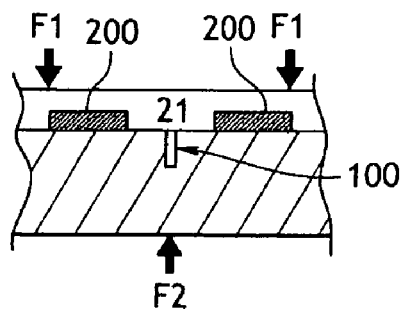

FIG. 4 diagrammatically illustrates the rupture of a layer comprising chips and the associated support, at one line of a weakening pattern.

These figures are diagrammatic representations on which the various elements are not to scale (in particular as regards the thickness of the layers, the number and spacing of the chips, etc).

DETAILED DESCRIPTION OF THE PREFERRED EMBODIMENTS

Accordingly, the invention aims to perfect the second above mentioned type of prior art method, in particular with a view towards overcoming the disadvantages linked to scribing of a thin substrate. In general, the aim of this invention is to improve the known methods mentioned above in the background. It is shown that in this respect, the invention enjoys specific advantages.

In an advantageous embodiment, the weakening patterns are disposed on the support so as to define support regions intended to receive the chips in accordance with a desired correlation. Preferably, the weakening patterns are disposed on the support to define support regions intended to receive the respective chips individually.

The forming of the weakening patterns generally involves etching a network of lines in the support. This etching may be chemical etching, mechanical etching, scribing the support or, in particular, anisotropic etching of the support. The anisotropic etching may be conducted to produce sharp edged profiles on the support.

The support generally has front and rear face and the weakening pattern may be provided only on one face. The weakening pattern is conveniently disposed on the front face of the support that contacts the chip-containing semiconductor layer, but it may instead be disposed on the rear face of the support. The cutting of the chip-containing layer along the weakening pattern can be conducted so that it also cuts the support, or it can only cut the layer without cutting the support. The weakening pattern is preferably formed on the support face by selectively attacking the support to create a network of trenches on the support face.

Prior to transferring the chip-containing layer, the method further comprises forming the support by assembling the individual tiles, with the boundaries between the individual tiles corresponding to the weakening pattern. The tiles are advantageously assembled by disposing a binder between the individual tiles, with the binder ensuring temporary bonding of the tiles. Then, the temporary bonds between the tiles can be undone during the cutting of the chip-containing layer. The temporary bonds can also be undone by dissolving the binder that is disposed between the tiles. The binder is preferably a reversible adhesive, a wax, or, a polymer, while the support is preferably formed from plastic, glass, polymer, or a metal.

The layer can be cut by rupturing the chip-containing layer in accordance with the weakening pattern in a manner such that during rupturing, only the chip-containing layer is broken, with the support remaining as a single unitary element. Alternatively, during rupturing, the support and the chip-containing layer are broken simultaneously, thus allowing a plurality of individual chips to be fabricated simultaneously.

The transfer of the chip-containing layer from the substrate to the support can be carried out by using any conventional transfer procedure such as the SMART-CUT®, BSOI®, or BESOI® methods.

The support may be fabricated by assembling bars or wires in a parallel orientation using a binder, with each bar or wire corresponding to an individual tile, and by cutting the assembled bars or wires in a plane substantially perpendicular to the longitudinal direction of the bars or wires. The section of the bars or wires substantially corresponds to the outline of the chips, and the tiles may be made of an optically transparent material, an electrically insulating material, or a thermally conductive material having a thermal conductivity of greater than 150 watts per meter ° C. (W/m° C.). Again, the tiles may be assembled by disposing a binder between the individual tiles, with the binder ensuring temporary bonding of the tiles. The supports represent another embodiment of the invention.

Figure 1:
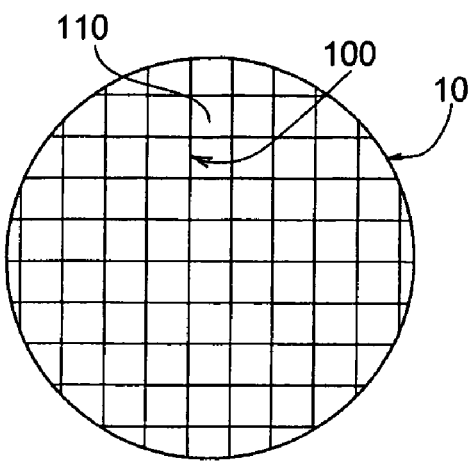
FIG. 1 is a diagrammatic representation of a support that can be used in the context of the invention.

FIG. 1 shows a top view of a support 10 that can be used in the context of the invention. The support 10 covers a surface corresponding to the surface of a layer comprising preformed chips which are 20 to be transferred to this support. The support 10 is produced from a semiconductor material such as silicon. It is also possible to produce the support 10 from some other material, for example glass, plastic, or a polymer having the desired properties, or from metal.

It should be noted that the surface of the support carries a plurality of lines 100 which define regions 110. These lines 100 and these regions 110 are located on the same face of the support (termed the weakened face). In a variation, it is possible to provide lines of the same type as lines 100, defining regions 110, on both faces of the support. In this case, both faces of the support are weakened. This feature is further described below.

The lines 100 correspond to the lines of weakness of the support and/or for guiding cutting of the chips, as is explained below. In any case, the lines 100 form a weakening pattern the role of which is explained below. More precisely, each region 110 is defined to correspond with one or more chips of a layer of semiconductor material which is to be transferred onto the support. Further, the weakening pattern corresponds to the cutting pattern for the chips in the layer which is to be transferred to the support.

The lines 100 may be formed on the support 10 by etching a network of trenches in the thickness of the support. This etching can in particular be chemical etching, carried out using a suitable mask leaving exposed only those portions of the support that correspond to lines 100. The support allowing lines 100 to be produced can also be etched by mechanical-type etching. The trenches may also be obtained by scribing partially through the thickness of the support in accordance with the desired cutting pattern.

It should be noted that the weakened face of the support can be the face of the support intended to come into contact with the transferred layer on which the chips have been formed previously. In a variation, it is also possible for the weakened face of the support to be the face opposite from the face of the support that is to receive the transferred layer. As stated above, it is also possible to ensure that both faces of the support are associated with a weakening pattern. In this case, the two patterns may be different to define regions 110 having different dimensions and/or they may he positioned differently on the surface of the support. As previously stated, the lines of weakness 100 may be trenches.

In contrast, these lines can also be constituted by profiles projecting from the surface of the support 10. They may be formed by anisotropic etching of the support (etching which can produce trenches of generally V-shaped cross section because of accelerated attack in certain crystallographic directions). The support may also have been formed from distinct individual elements which correspond to regions 110.

Figure 2A:
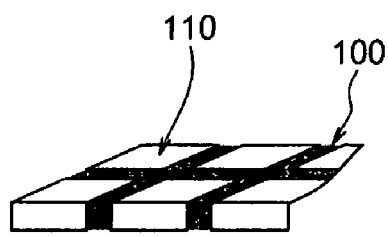
FIG. 2a is a fragmentary diagrammatic representation of the surface of a support that can be used in one implementation of the invention.

FIG. 2a illustrates a portion of the weakened surface of a support 10 in which the individual regions 110 are tiles of a material such as those mentioned above to constitute the support. The tiles 110 are connected together by a binder which constitutes lines 100. The binder can, for example, be a reversible adhesive, a wax, a polymer, or any binder which can be dissolved.

Figure 2B:
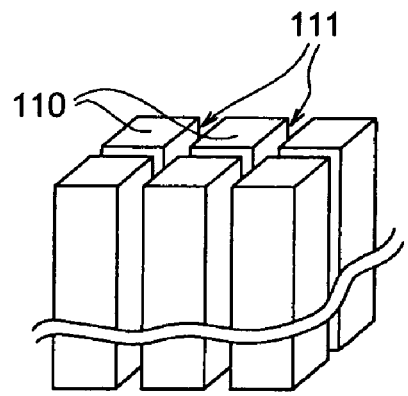

FIG. 2b illustrates an embodiment of a support as shown in FIG. 2a. In this figure, a plurality of bars or wires 111 is shown disposed parallel to one another, so that their positioning corresponds to the desired positioning for the regions 110. The section of each bar or wire 111 corresponds to the outline desired for the corresponding region 110 (in the case shown here, the bars are of a square section). After the bars or wires 111 have been positioned in this way, the binder is introduced between them to render them integral with each other. The resulting assembly is then cut in a cutting direction which is transverse to the axis of the bars. This produces "wafers" each one of which corresponds to a support of the type diagrammatically shown in FIG. 1.

Figure 3A:
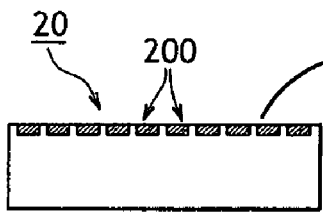
FIGS. 3a to 3c are diagrammatic representations of three steps that can be employed in the context of the invention.

A preferred manner of carrying out the invention is described below with reference to FIGS. 3a to 3c. FIG. 3a shows a substrate 20 with the circuits of a plurality of chips 200 formed in its surface region. These circuits are formed simultaneously, during a prior chip formation step. The chips are disposed on the surface of the substrate 20 in a desired disposition which corresponds, as stated previously, to the disposition of regions 110 of a support intended to receive a layer derived from the substrate 20. The layer derived from substrate 20 is then transferred onto the support. It may be a layer that is "thin" in the meaning of the present text, i.e., a layer having a thickness of the order of 0.1 µm to 10 µm. The substrate 20 may be produced from silicon, for example.

After the chips have been formed on the substrate 20, the substrate is then assembled on a support 10 having its regions 110 disposed to correlate with the chips 200 of the substrate 20. The "assembly" effect is produced by intimate contact between the substrate 20 and the support 10, which ensures a mechanical bond between the two elements. The assembly could also be produced by adhesive bonding, in particular. The contact surface of the support and/or that of the substrate may be cleaned prior to assembly.

In a preferred implementation, each region 110 of the support corresponds individually to a chip 200 of the substrate 20. In this case, each chip faces a region 110 of the support during assembly. It is also possible to provide any desired type of correspondence between the regions 110 of the support and the chips or groups of chips of the substrate 20 (allocating certain groups of chips to certain regions, etc). While the substrate 20 is being assembled with the support 10, the face of the substrate 20 which is brought into contact with the support 10 is the face carrying the chips 200. It should be recalled that the weakened face of the support 10 can face either towards the substrate 20, in contact with the chips, or away from it.

Figure 3B:
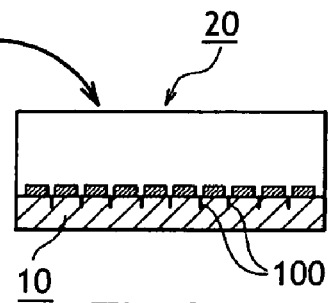

This forms an intermediate structure, as shown in FIG. 3b (on which the support 10 is shown in hatched lines). This figure also diagrammatically shows the lines 100 of the weakened face of the support (which in this case defines regions individually corresponding to chips 200).

Figure 3C:
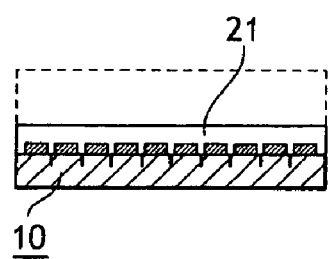

As can be seen in FIG. 3c, the material of the substrate 20 is then removed, retaining only a layer 21 of the desired thickness in contact with the support 10. By way of example, this thickness can be of the order of 0.1 µm to a few micrometers. The layer 21 includes the chips 200 in its thickness. The material can be removed by attacking the back face of the substrate 20. This attack may be chemical and/or mechanical attack. It is also possible to carry out material removal by detaching the substrate 20 at a zone of weakness that has previously been formed in the thickness of the substrate. In this case, the zone of weakness is preferably been formed before assembling together the support 10 and the substrate 20.

This zone of weakness may in particular be formed by implanting into the thickness of the substrate one or more atomic and/or ionic species. In this implementation of the invention, a SMART-CUT®-type method is used. Any other type of transfer with removal of material may also be envisaged (forming a substrate 24 of the detachable type including a zone of weakness produced by a porous region of the substrate 20, for example, or by controlling the bonding energy between two layers of substrate 20, or by using a BSOI® or BESOI® type transfer technique).

In a variation of the invention, prior to assembling together the substrate 20 and the support 14 (for example by bonding), the surface of the substrate 20 which is brought into contact with the support 10 is marked. This "marking" corresponds to attacking the surface of the substrate 20, using a pattern which corresponds (partially or completely) to the predetermined cutting pattern. Marking can be achieved by scribing the substrate surface very lightly. The scribing is extremely shallow; it is only intended to interrupt the continuity of the surface of the substrate, producing very light score lines. This marking further prevents flaking during subsequent cutting. It can also allow the chips to be isolated during cutting, which contributes to protecting them.

After a structure comprising the support 10 and the thin layer 21 including the chips 200 has been formed in this way, the chips are then cut apart. To carry out this cutting, it is not necessary to scribe the thin layer 21. In the invention, cutting can be achieved simply by rupturing the layer 21 at the lanes 104 which separate the regions 110 (and thus the corresponding regions of the layer 21, with which the various chips 200 or the various groups of chips are associated depending on how the regions 110 of the support and the chips or groups of chips are correlated). This rupturing can be achieved by simultaneously exerting stress on the layer 21 and on the support 10 with which the layer 21 is associated.

As an example, it is possible to exert a compressive stress on the layer 21 in the same direction perpendicular to the surface of the layer and acting in the same direction either side of a line 100 of the support (arrows F1), as shown diagrammatically in FIG. 4. In this case, the layer and the support can be kept stable at the line 100 (arrow F2). A bending stress is thus exerted at line 100. This stress ruptures the layer 21 at the line 100.

It is also possible to form lines of weakness on the surface of the layer 21 itself, between the chips 200. During rupturing, it is possible:

either to break only the layer 21 in order to cut 20 and separate the various chips 200, while the corresponding regions of the support 10 remain integral; or to break not only the layer 21 in order to cut out the chips, and also to break the support itself, and thus separate the various regions 110.

In the first case mentioned above, it may be advantageous to ensure that the support has a certain amount of flexibility so that it can deform without breaking while the layer 21 is being ruptured. In particular, such flexibility can be achieved by means of the mechanical properties of a binder between distinct support regions 110, as shown in FIGS. 2a and 2b. In this case, the binder is selected to allow a certain amount of deformation between the regions 110, while keeping these regions integral. In such a case, it is possible:

either to separate the regions 110 of the support in a second stage, to obtain a plurality of chips individually associated with regions 130 in accordance with the desired correlation; or to separate the chips from the support substantially, to obtain single chips which are not associated with a portion of the support.

For example, this separation of the chips and the support can be achieved by breaking the bond at the interface between the layer 21 and the support 10 (i.e. the bond was formed in a reversible manner).

In the second case mentioned above, it is also possible for the support to be formed by distinct tiles, as shown in FIG. 2a. The binder between the tiles can in this case be broken under the rupturing stress; or be eliminated during rupture (for example by dissolving the binder).

In any event, in the second case, the binder only temporarily binds the regions 110. At the end of this method, a plurality of separate individual chips 200 is obtained (or groups of chips, depending how the chips and the regions 110 of the support are correlated).

It is possible to select the material of the support so that it has the desired properties. It is also possible for the material to be optically transparent (a quartz or glass support, for example). It is also possible to select an electrical. conductor as the material (i.e. a material with a resistivity that is typically less than 1 ohms.square centimeter ($\Omega.cm^2$)—a material such as copper can be used for this purpose—or, in contrast, an insulator (i.e. having a resistivity that is typically more than 1 $\Omega cm^2$—where a material such as glass or plastic can be used). In similar manner, it is also possible to select a heat conductor (for example copper, diamond, etc) or an insulator (for example glass or plastic, etc) as the material. In the case of a conductive material, then typically a material with a thermal conductivity of more than 150/m° C. is used, a value which corresponds to the conductivity of silicon.

What is claimed is:

1. A method of fabricating a plurality of chips, each chip comprising at least one circuit, which method comprises the following steps in succession:

creating chips on a layer of semiconductor material that is integral with a substrate;

forming a weakening pattern corresponding to a predetermined cutting pattern on a support;

transferring a layer of semiconductor material that contains the chips from the substrate to the support; and forming individual chips by cutting the chip-containing layer in accordance with the predetermined cutting pattern.

2. The method according to claim 1, wherein the weakening patterns are disposed on the support so as to define support regions intended to receive the chips in accordance with a desired correlation.

3. The method according to claim 1, wherein the weakening patterns are disposed on the support to define support regions intended to receive the respective chips individually.

4. The method according to claim 1, wherein the forming of the weakening patterns involves etching a network of lines in the support.

5. The method according to claim 4, wherein the etching is chemical etching.

6. The method according to claim 4, wherein the etching is mechanical etching.

7. The method according to claim 6, wherein the etching comprises scribing the support.

8. The method according to claim 4, wherein the etching includes anisotropic etching of the support.

9. The method according to claim 8, wherein the anisotropic etching is conducted to produce sharp edged profiles on the support.

10. The method according to claim 1, wherein the support has front and rear face and the weakening pattern is provided only on one face.

11. The method according to claim 10, wherein the weakening pattern is disposed on the front face of the support that contacts the chip-containing semiconductor layer.

12. The method according to claim 10, wherein the weakening pattern is disposed on the rear face of the support.

13. The method according to claim 10, wherein cutting of the chip-containing layer along the weakening pattern also cuts the support.

14. The method according to claim 10, wherein the weakening pattern is formed on the support face by selectively attacking the support to create a network of trenches on the support face.

15. The method according to claim 1, wherein prior to transferring the chip-containing layer, the method further comprises forming the support by assembling the individual tiles, with the boundaries between the individual tiles corresponding to the weakening pattern.

16. The method according to claim 15, wherein the tiles are assembled by disposing a binder between the individual tiles, with the binder ensuring temporary bonding of the tiles.

17. The method according to claim 16, wherein the temporary bonds between the tiles are undone during the cutting of the chip-containing layer.

18. The method according to claim 16, wherein the temporary bonds are undone by dissolving the binder that is disposed between the tiles.

19. The method according to claim 16, wherein the binder is a reversible adhesive, a wax, or, a polymer.

20. The method according to claim 1, wherein the support is formed from plastic, glass, polymer, or a metal.

21. The method according to claim 1, wherein the layer is cut by rupturing the chip-containing layer in accordance with the weakening pattern.

22. The method according to claim 21, wherein during rupturing, only the chip-containing layer is broken, with the support remaining as a single unitary element.

23. The method according to claim 21, wherein during rupturing, the support and the chip-containing layer are broken simultaneously.

24. The method according to claim 1, wherein a plurality of individual chips are fabricated simultaneously.

25. The method according to claim 1, wherein the transfer of the chip-containing layer from the substrate to the support is carried out using a layer transfer method.

26. The method according to claim 1, wherein the support is fabricated by assembling bars or wires in a parallel orientation using a binder, with each bar or wire corresponding to an individual tile, and by cutting the assembled bars or wires in a plane substantially perpendicular to the longitudinal direction of the bars or wires.

27. The method according to claim 26, wherein the section of the bars or wires substantially corresponds to the outline of the chips.

28. The method according to claim 1, wherein the support of the chip-containing layer is made of an optically transparent material, an electrically insulating material, or a thermally conductive material having a thermal conductivity of greater than 150 W/m° C.

29. The method according to claim 1, wherein the support of the chip-containing layer is made by assembling a plurality of individual tiles with boundaries between the individual tiles corresponding to the weakening pattern.

30. The method according to claim 29 wherein the tiles are assembled by disposing a binder between the individual tiles, with the binder ensuring temporary bonding of the tiles.

* * * * *

UNITED STATES PATENT AND TRADEMARK OFFICE
CERTIFICATE OF CORRECTION

PATENT NO. : 7,544,586 B2  Page 1 of 1
APPLICATION NO. : 11/136252
DATED : June 9, 2009
INVENTOR(S) : Ghyselen et al.

It is certified that error appears in the above-identified patent and that said Letters Patent is hereby corrected as shown below:

Title Page:
Item (73) Assignee, change "S.O.I. Tec" to "S.O.I.Tec". The assignee will then correctly appear as "S.O.I.Tec Silicon on Insulator Technologies".

Signed and Sealed this

Fourteenth Day of July, 2009

JOHN DOLL
*Acting Director of the United States Patent and Trademark Office*